United States Patent [19]

Baker

[11] 4,042,889
[45] Aug. 16, 1977

[54] OVERVOLTAGE PROTECTION CIRCUIT FOR GENERAL PURPOSE AMPLIFIER

[75] Inventor: Roxton Elliott Baker, Ellington, Conn.

[73] Assignee: Combustion Engineering, Inc., Windsor, Conn.

[21] Appl. No.: 686,627

[22] Filed: May 14, 1976

[51] Int. Cl.$^2$ ............................................ H03F 21/00
[52] U.S. Cl. .................................. 330/207 P; 330/17; 330/22; 330/28; 330/110
[58] Field of Search ............. 307/202; 330/17, 207 P, 330/13, 28, 110, 22

[56] References Cited
U.S. PATENT DOCUMENTS

| | | | |
|---|---|---|---|
| 3,536,958 | 10/1970 | Sondermeyer | 330/207 PX |
| 3,631,357 | 12/1971 | Hadley | 330/17 |
| 3,822,408 | 7/1974 | Veranth | 330/110 X |

Primary Examiner—Rudolph V. Rolinec
Assistant Examiner—Lawrence J. Dahl
Attorney, Agent, or Firm—Joseph H. Born

[57] ABSTRACT

An output stage and feedback circuit for a buffer amplifier are disclosed. The output stage protects an operational-amplifier circuit preceding it from overvoltages appearing at the load. The circuit includes a pair of complementary transistors in a push-pull arrangement that sources and sinks current to and from the load. Both the transistors are in common-emitter configurations, and each one has a corresponding diode connected between its collector and the load in an orientation opposite that of the collector-base junction. The diodes prevent the reverse current that would otherwise flow in response to an output overvoltage of the polarity that forward biases the collector-base junction of the transistor, and the over-voltage is thereby prevented from being seen at the operational-amplifier output terminal. Overvoltages of the other polarity are not seen because they reverse bias the base-collector junction. Each amplifier transistor also has associated with it an auxiliary transistor whose base is connected through a zener diode to the output terminal of the circuit. The auxiliary transistor is connected between the output-stage amplifier and a source voltage. An output overvoltage of the right polarity and sufficiently large to turn on the zener diode therefore turns on the auxiliary transistor. This turns off the amplifier transistor that would otherwise be on, thereby preventing thermal destruction of the amplifier transistor.

5 Claims, 2 Drawing Figures

OVERVOLTAGE PROTECTION CIRCUIT FOR GENERAL PURPOSE AMPLIFIER

BACKGROUND OF THE INVENTION

In many applications that require the transmission of signals from point to point in a plant, it is necessary to isolate various points by means of buffer amplifiers in the signal lines. In many cases, a fair degree of accuracy in the reproduction of the signals, which may be DC analog signals, is required. Accordingly, it is typical for the system designer to choose a commercial operational amplifier for this function that has specifications conforming to the accuracy requirements may not be the only factors that enter into the designer's choice of amplifier. For example, if there is a possibility that overvoltages will be seen in the signal lines, the designer must be concerned with whether the operational amplifier can withstand the overvoltages expected.

In order to eliminate the overvoltage requirement as a constraint on amplifier choice, designers have employed circuitry external to the operation amplifier to furnish overvoltage protection. One way to accomplish this is to clamp the operational-amplifier output between predetermined threshold voltages by connecting normally back-biased diodes to reference voltage sources. In order to use this type of protection effectively, it is normally necessary to include a large resistance in the output circuit across which the overvoltage potential can be dropped. This does not necessarily increase the output impedance significantly if appropriate feedback is included, but it does severely limit the current capability of the circuit, and the current restriction is a major drawback of this type of protection circuit.

SUMMARY OF THE INVENTION

Accordingly, it is an object of the present invention to provide an output circuit for use with commercial operational amplifiers that provides output protection without sacrificing load-current capability.

According to the present invention, an ouput transistor arranged in a common-emitter configuration follows the operational amplifier. A diode is included in the collector circuit and oriented to conduct in the direction of the normal operating current through the collector. The result is that an over-voltage in one direction prevented from reaching the operational-amplifier output by the back-biased collector-base junction, while an overvoltage of the polarity necessary to forward bias the collector-base junction is prevented from being seen at the operational-amplifier output by the diode in the collector circuit. In order to prevent the overvoltage from causing a high level of power dissipation in the amplifier transistor, an auxiliary transistor that turns on in response to overvoltages at the output is connected across the base-emitter junction, thereby turning on the output amplifier at the occurrence of an overvoltage. This also increases the amount of over-voltage the amplifier transistor can withstand.

In order to insure that the accuracy of the total circuit depends only upon the accuracy of the operational amplifier, a feedback circuit is provided between a circuit output terminal and an input terminal of the operational amplifier. This circuit is clamped between two threshold voltages in order to protect the input terminal from output overvoltages.

DETAILED DESCRIPTION OF THE PREFERRED EMBODIMENT

Figure 1:
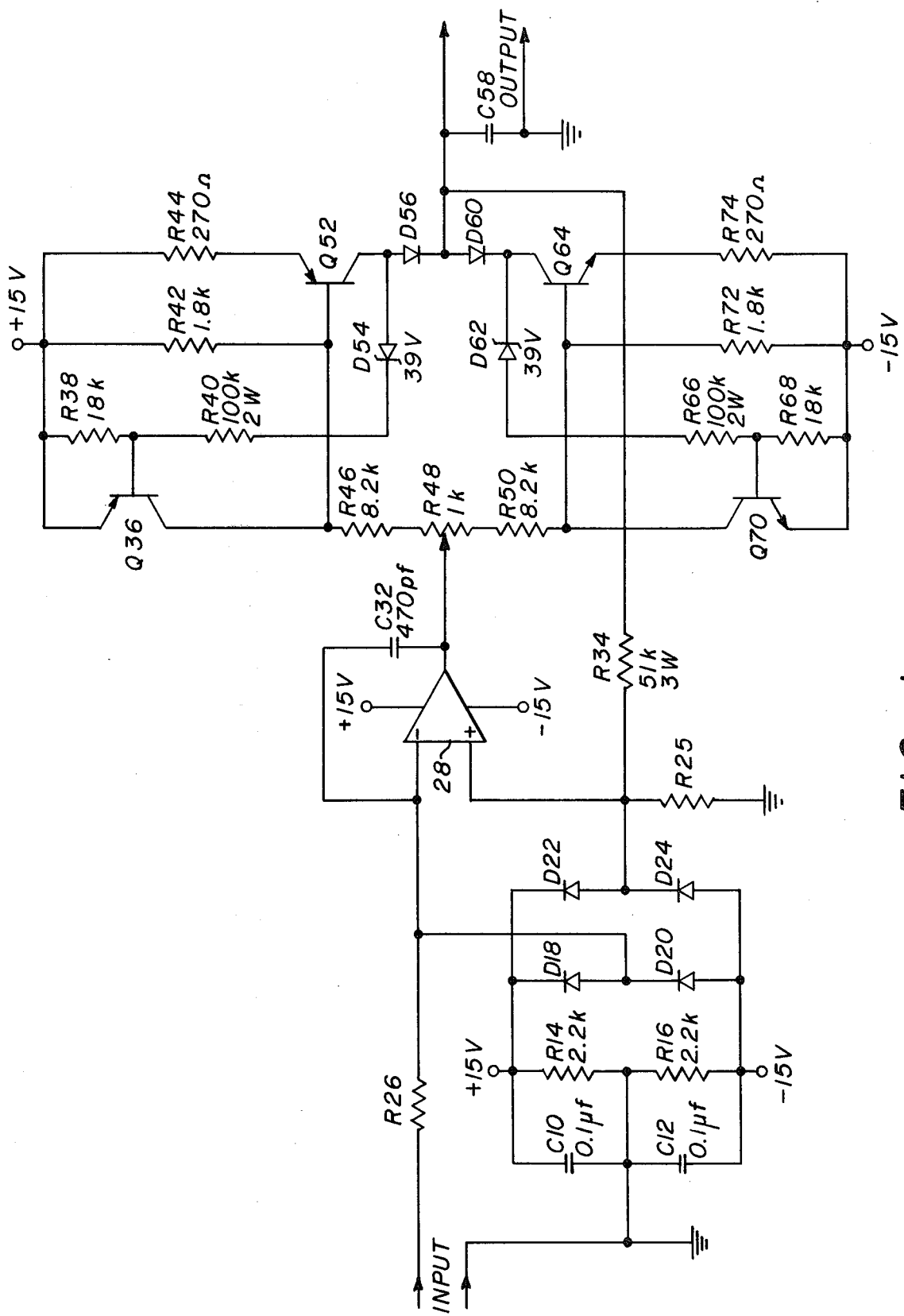
FIG. 1 is a schematic diagram of the preferred embodiment of the present invention.

FIG. 1 shows a general-purpose buffer amplifier with an output stage according to the present invention. This example of the output stage is designed to have an output range of −10 volts to +10 volts with a current capability of 10 milliamperes into 1 kilohm. It is intended that the circuit be capable of withstanding a 300-volt overvoltage appearing across its output terminals.

The input signal appears at the left of R26, and the output-stage output appears at the junction of diodes D56 and D60. Resistors R42, R46, R48, R50 and R72 constitute a bias network both for pnp transistor Q52 and for npn transistor Q64. Due to the fact that the circuit depends only on operational amplifier 28 for its accuracy, Q52 and Q64 can be chosen for their high breakdown voltages alone. In order that amplifier transistors Q52 and Q64 have approximately the same quiescent operating points, R42 has the same value as R72, and R46 has the same value as R50. The wiper of potentiometer R48 is used to adjust the operating points of Q52 and Q64 so that the output voltage at the junction of D56 and D60 is zero when the voltage at the ouptut terminal of operational amplifier 28 is zero. Resistors R44 and R74 provide negative feedback to transistors Q52 and Q64, respectively. This feedback acts to limit the maximum current that either amplifier transistor can carry to approximately 15 milliamperes, and this limitation insures that the amplifier transistors are not damaged due to internal power dissipation when the output is subjected to an overvoltage that has an amplitude insufficient to cause associated protective circuitry to turn off the transistor.

Q52 constitutes part of a transistor amplifier in which R42, R44, R46, R48, R50, R72, and the +15-volt and −15-volt sources constitute a bias circuit. R44 is a first resistive path between a first constant-voltage source, the +15-volt source, and the emitter of a first transistor, Q52. A second resistive path between a first constant-voltage source and a second constant-voltage source, the −15-volt source, comprises R42, R48, R50 and R72; it contains the wiper of R48, which is a first node communicating with the output terminal of an amplifier, operational amplifier 28, and the junction of R42 and R46, which is a second node that communicates with the base of the first transistor. Q64 constitutes part of another transistor amplifier in which R42, R46, R48, R50, R72, R74, and the +15-volt and 31 15-volt sources constitute the bias circuit. R74 is the first resistive path, and R42, R46, R48, R50, and R72 constitute the second resistive path, the wiper of R48 being the first node and the junction of R50 and R72 being the second node.

Capacitors C32 and C58 depend upon the characteristics of operational amplifier 28 and the input and load impedances seen by the circuit. Their purpose is to prevent instability by reducing the gain of the circuit at those frequencies at which phase shift would cause positive feedback. D56 and C58 together constitute an output circuit associated with the Q52 transistor amplifier, while D60 and C58 together constitute an output circuit associated with the Q64 transistor amplifier. Capacitors C10 and C12 provide power-supply filtering.

Assuming the condition of a zero-volt output from operational amplifer 28, the voltage-divider effect of R42, R46, R48, R50, and R72 causes a 12.4-volt potential at the base of Q52 and a −12.4-volt potential at the base of Q64. The contribution of the currents at the bases of Q52 and Q64 was ignored in arriving at these potentials, since they are negligible in comparison with the voltage-divider current. The current at the output of operational amplifier 28 was also ignored because only a small current is necessary to balance transistors Q52 and Q64. Assuming silicon ransistors, the emitter voltage of Q52 is 13 volts, and the emitter voltage of Q64 is −13 volts, which means that approximately 7.4 milliamperes flows through R44 and R74. In this quiescent state, it can be seen that the potential at the p side of D56 is 0.6 volt due to its diode drop, and zener diode D54 does not conduct because the voltage drop across it is approximately 14.4 volts, which is below its turn-on voltage of 39 volts. Similarly, D62 also does not conduct. As a result, no bias current flows in the bases of Q36 and Q70, so they are not conducting and therefore not contributing to the current in the bias network for Q52 and Q64. The zero-volt signal at the junction of D56 and D60 is fed back through feed-back resistor R34 to the plus input terminal of operational amplifier 28. Since a zero-volt output from operational amplifier 28 has been assumed, it can be inferred that the input voltage appearing at the minus input terminal of operational amplifier 28 is the same as that at its plus input terminal, which is zero volts by assumption. With the feedback and input signals both at zero volts, diodes D18, D20, D22, and D24 are all back biased and only contribute a neglible amount of current to the rest of the circuit.

If a new signal of +10 volts, which is the limit to which the preferred embodiment is designed, appears at the input to the buffer amplifier, a more negative signal is generated at the output terminal of operational amplifier 28. As a result, more current is drawn through the R42-R46-R48 portion of the bias circuit, and less current flows from R48 to R50 and R72. Thus, the base voltage of Q52 decreases, causing it to draw more current through R44. Since less current is flowing through R72, Q64 is made less conductive, causing less current to flow through R74. The difference between the current in R44 and that in R72 appears in the load impedance, causing its voltage to increase. This voltage is in turn fed back through feedback resistor R34 to the plus input of amplifier 28, where it is compared with the input voltage. Since operational amplifier 28 amplifies the difference between the feedback signal and the input signal, operational amplifier 28 drives the bias circuit to a point at which the voltage across R25 equals the signal at the negative input terminal of amplifier 28. In the unity-gain embodiment, R25 is infinite, so the signal across it is that of the output-stage output. Accordingly, the 10-volt input signal appears at the output of the buffer. Again, the voltages across D54 and D72 are not sufficient to turn them on, so Q36 and Q70 do not contribute to the operation of the circuit.

If the buffer is to be operated as other than a unity-gain amplifier, the output voltage is divided across R34 and R25, and the output signal is then equal to the input multiplied by (R34+R25)/R25. (This, of course, assumes an input small enough to avoid saturating Q52.)

If it is assumed that there is a 1-kilohm load at the output terminal of the buffer amplifier, then under the 10-volt-input assumption there must be a 10-milliampere difference between the collector current of Q52 and the collector current of Q64 if the circuit is set up for unity gain. In order to effect this change, operational amplifier 28 draws approximately an extra 0.75 milliampere and changes its output voltage by something under 8 volts. This is well within the capabilities of most commercial operational amplifiers. The collector voltage of Q52 is approximately 10.6 volts, and its emitter voltage is approximately 11.6 volts, so Q52 is still biased to operate in its active region. Q64 has an emitter voltage of around −14.4 volts, so it is not turned all the way off. This discussion shows that all the elements of the circuit operate within their limits at the voltage and current limits of the circuit, so the circuit meets its objective of high current capability.

In addition to high current capability, a protective function is also an objective of the circuit. This function can be observed by assuming a large overvoltage at the output terminal. An overvoltage potential impressed between ground and the output terminal of the buffer amplifier finds no current path into the upper half of the circuit because D56 is back biased. There is also no current path from the circuit output terminal to the operational-amplifier output terminal through the lower circuit because the collector-base junction of Q64 is back biased, preventing current flow through that path. Accordingly, operational amplifier 28 is protected from the overvoltages. However, even though operational amplifier 28 is protected, serious power dissipation in Q64 caused by a large overvoltage could damage Q64, possibly causing the collector-base junction of Q64 to fail short. This, of course, would remove the protection afforded operational amplifier 28 by Q64. R74 is included to alleviate this problem, as are R74 and its associated circuitry. When an over-voltage of a magnitude less than 25 volts appears on the output, operational amplifier 28 senses it and attempts to reduce it by the normal circuit action of causing Q64 to draw more current. To keep this current limited so that Q64 does not overheat, negative feedback is introduced by emitter resistor R74. The potential developed across this resistor opposes the driving potential from operational amplifier 28 so that the current through Q64 is limited to about 15 milliamperes, even when the output of operational amplifier 28 is at its highest potential. This limits the internal power dissipation of Q64 to 0.6 watt, which is well within is rating.

Should the output overvoltage increase to a magnitude greater than 25 volts, there is at least a 40-volt potential difference between the negative source voltage and the circuit output. This is sufficient to turn on the zener diode, allowing sufficient current to flow into the base of Q70 to cause it to turn all the way on. This reduces the base potential of Q64 sufficiently to turn it off. Accordingly, the large power dissipation of Q64 is eliminated, and Q64 is able to withstand its full rated breakdown voltage. This points up one of the advantages of the circuit, which is that, because the accuracy of the circuit is determined almost completely by the accuracy of operational amplifier 28, Q52 and Q64 can be chosen for their large breakdown voltages alone. Commercial complementary transistors capable of withstanding 315 volts in the configuration of this specification are readily available.

Symmetry considerations indicate that protection would also result if a large negative overvoltage were to appear at the output terminal of the output stage. Thus, D54, R38, R40, Q36, and the +15-volt source together constitute a means for eliminating base bias voltage from the first transistor, and D62, R66, R68, Q70 and the −15-volt source also constitute such a means. Q36 and Q70 are both examples of the "second transistor" mentioned in the claims, while the D54-R40 and D62-R66 combinations are both examples of the "second current path" in the claims.

The input terminals of operational amplifier 28 are also protected from output overvoltages by the circuit of the preferred embodiment. If a −300-volt potential is assumed at the circuit output terminal, a potential difference of approximately 285 volts results across R34, the feedback resistor, because forward-biased diode D24 allows a −15.6-volt potential to be applied to the left side of R34. Because the tendency of the overvoltage is to draw the source voltage more negative than its rated voltage, the source tends to stop sinking current. If it were to stop completely, the R34-R16 combination would divide the 300-volt potential down to a potential less negative than −15 volts, which would make the power supply start sinking current again. An equilibrium between these tendencies results in a −15-volt potential at the source terminal and a −15.6-volt potential at the D22-D24 junction. Thus, D22, D24, R14, R16, and the +15-volt and −15-volt sources constitute a clamping circuit. In the context of this clamping circuit, the +15-volt and −15-volt sources constitute first and second threshold-voltage sources.

Because of this protective function of R16, the clamping puts no constraints on the power-supply specifications, and the 1.6-watt dissipation in R34 is well within its 3-watt capacity. Also, the potential seen at the positive input terminal of operational amplifier 28 is −15.6 volts, which does not constitute a very severe constraint on the specifications of the operational amplifier.

Symmetry considerations 1indicate that input protection will also be afforded if a large positive overvoltage were to appear at the buffer output terminal.

Similarly, R26, in conjunction with D18 and D20, provides the same protection from input overvoltages that R34, in conjunction with D22 and D24, provides from output overvoltages. This protection is obtained as long as R26 and the output impedance of the previous stage add to at least 42 kilohms, the amount of resistance required to drop a 300-volt overvoltage to 15 volts when used with R14 or R16 as a voltage divider.

Figure 2:
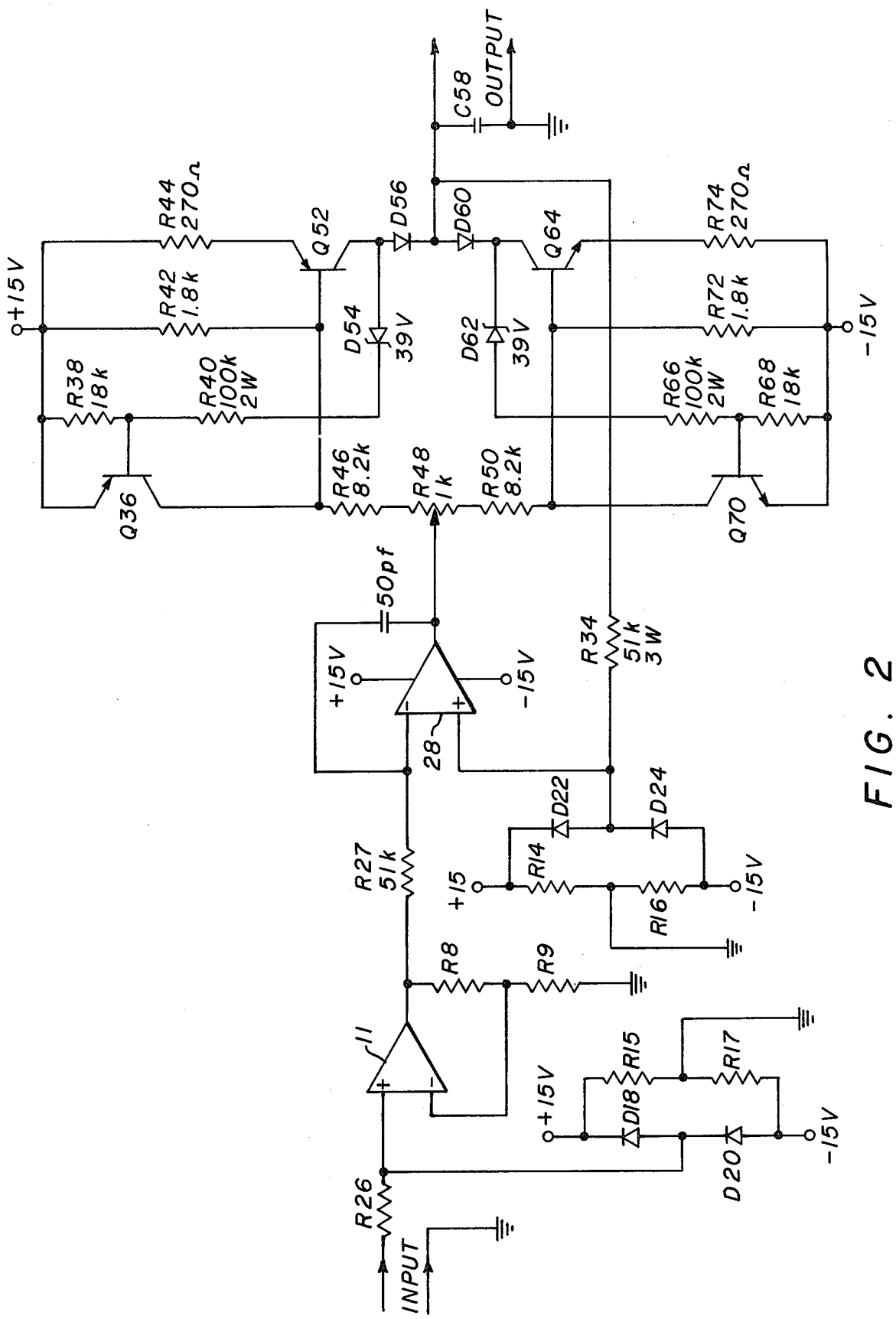
FIG. 2 is a schematic diagram of a further refinement of the preferred embodiment.

A final refinement on this circuit can be achieved by buffering the input of the operational amplifier. Overvoltages appearing at the output terminal of the output stage cause signals to be seen at the plus input terminal of the operational amplifier. This affects the current flow into the minus terminal, causing a resulting signal to occur across the output impedance of the preceding stage. The overvoltage can thereby affect the signal that is seen by the other loads of the preceding stage. In order to preclude this overvoltage feedback, the embodiment of FIG. 2 can be employed. This embodiment uses noninverting amplifier 11 to buffer the input, providing an output impedance sufficiently low to essentially eliminate the effect of the overvoltage on the signal from the preceding stage. In addition, this arrangement permits one to set the gain by choosing R8 and R9, which can be picked for their tracking ability, rather than attempting to choose an R25 (see FIG. 1) that tracks 3-watt resistor R34. With the exception of the additional buffering, the FIG.-2 circuit is identical to that of FIG. 1.

It is therefore apparent that the output stage of the present invention accomplishes the objective of affording an accuracy dependent almost exclusively on the characteristics of the operational amplifier while providing overvoltage protection without serious limitations on output current.

What is claimed is:

1. In a buffer-amplifier circuit including an amplifier having an output terminal and a plus and a minus input terminal, an output stage following the amplifier for driving a load and protecting the amplifier comprising:
   a. a transistor amplifier circuit including a first transistor having a base, a collector, an emitter, and a collector-base junction, and a bias circuit, having a first node communicating with the outlet terminal of the amplifier, for biasing the first transistor;
   b. an output circuit connecting a load to the collector of the first transistor and including a first diode whose junction is oriented opposite the collector-base junction of the transistor;
   c. a first current path connecting the output circuit to an input terminal of the amplifier;
   d. a clamping circuit, connected to the plus terminal of the amplifier, for clamping the signal at the plus terminal between two threshold voltages;
   e. a second transistor having a collector, an emitter, and a base, the collector of the second transistor communicating with the base of the first transistor and the emitter of the second transistor communicating with the emitter of the first transistor; and
   f. a second current path connecting the output circuit to the base of the second transistor and comprising a zener diode.

2. The output stage of the claim 1 wherein the clamping circuit comprises a first threshold-voltage source, a second diode with an $n$ terminal and a $p$ terminal, the $p$ terminal of the second diode being connected to the plus terminal of the amplifier and the $n$ terminal of the second diode being tied to the first threshold voltage source, a second threshold voltage source, and a third diode with an $n$ terminal and a $p$ terminal, the n terminal of the third diode being connected to the plus terminal of the amplifier and the $p$ terminal of the third diode being tied to the second threshold-voltage source.

3. The output stage of claim 2 wherein the bias circuit comprises a first constant-voltage source, a first resistive path between the first constant-voltage source and the emitter of the first transistor, a second constant-voltage source, a second resistive path between the first constant-voltage source and the second constant-voltage source, and a second node, located in the second resistive path, that communicates with the base of the first transistor.

4. The output stage of claim 3 wherein the second current path further comprises a third node that is located in the output circuit between the first diode and the collector of the first transistor.

5. The output stage of claim 4 wherein the clamping circuit further comprises a ground terminal and a first and second resistances, the first resistance being disposed between the $n$ terminal of the second diode and the ground terminal, the second resistance being disposed between the $p$ terminal of the third diode and the ground terminal.

* * * * *

UNITED STATES PATENT OFFICE
CERTIFICATE OF CORRECTION

Patent No. 4,042,889            Dated August 16, 1977

Inventor(s) Roxton Elliott Baker

It is certified that error appears in the above-identified patent and that said Letters Patent are hereby corrected as shown below:

Column 1, line 14, after "requirements" insert --of the system. However, accuracy requirements--.
Column 1, line 48, after "direction" insert --is--.
Column 2, line 49, after "R42," insert --R46,--.
Column 2, line 56, after "+15-volt and" delete "31" and insert -- -- --.
Column 3, line 14, change "ransistors," to --transistors,--.
Column 4, line 51, after "within" change "is" to --its--.
Column 4, line 59, after "dissipation" change "of" to --in--.

*Signed and Sealed this*

*Twenty-fourth* Day of *April 1979*

[SEAL]

Attest:

RUTH C. MASON
*Attesting Officer*

DONALD W. BANNER
*Commissioner of Patents and Trademarks*